US012772784B2

(12) United States Patent
Albelo et al.

(10) Patent No.: US 12,772,784 B2
(45) Date of Patent: Oct. 20, 2026

(54) METHOD OF SEMICONDUCTOR FABRICATION

(71) Applicants: Jeffrey Albelo, Beaverton, OR (US); William Robertson, Beaverton, OR (US)

(72) Inventors: Jeffrey Albelo, Beaverton, OR (US); William Robertson, Beaverton, OR (US)

(73) Assignee: NANOVERSE TECHNOLOGIES LTD, Beaverton, OR (US)

( * ) Notice: Subject to any disclaimer, the term of this patent is extended or adjusted under 35 U.S.C. 154(b) by 324 days.

(21) Appl. No.: 18/404,765

(22) Filed: Jan. 4, 2024

(65) Prior Publication Data

US 2025/0226250 A1 Jul. 10, 2025

(51) Int. Cl.

| | |
|---|---|
| ***H01L 21/67*** | (2006.01) |
| ***H01L 21/66*** | (2006.01) |
| ***H01L 21/677*** | (2006.01) |
| ***H01L 21/68*** | (2006.01) |
| ***H10P 72/00*** | (2026.01) |
| ***H10P 72/30*** | (2026.01) |
| ***H10P 72/50*** | (2026.01) |
| ***H10P 74/00*** | (2026.01) |

(52) U.S. Cl.

CPC ...... *H10P 72/0612* (2026.01); *H10P 72/0618* (2026.01); *H10P 72/3304* (2026.01); *H10P 72/53* (2026.01); *H10P 74/238* (2026.01); *H10P 72/0604* (2026.01); *H10P 72/0616* (2026.01)

(58) Field of Classification Search

CPC ............ H10P 72/0612; H10P 72/0618; H10P 72/3304; H10P 72/53; H10P 74/238; H10P 72/0604; H10P 72/0616

See application file for complete search history.

(56) References Cited

U.S. PATENT DOCUMENTS

2019/0257647 A1* 8/2019 Ichinose ............ G03F 7/70633

* cited by examiner

*Primary Examiner* — Charles R Kasenge
(74) *Attorney, Agent, or Firm* — Mark S Hubert

(57) ABSTRACT

A method for using a smart EFEM in a semiconductor wafer process facility that incorporates at least one metrology testing device in a metrology unit positioned in operational proximity to the pre-alignment unit. The pre-alignment unit has a metrology chuck (platter) that two robotic arms shuttle the Si wafers onto, and that has a dimeter equivalent or larger than the diameter of the Si wafers being processed/analysed. The metrology unit may be rotated about an axis or the per-aligner chuck may be rotated so long as structured light used in the interferometric and ellipsometric signals is rotated about the wafer. This enables high resolution data to be collected at every process step with no impact to process cycle time. And will allow full wafer tracking throughout the entire fabrication process for every wafer. This data can be uploaded into the operational mainframe computer of the analysis and processing network and subjected to AI pattern analysis to diagnose issues in the process before they can affect production yield.

9 Claims, 15 Drawing Sheets

METHOD OF SEMICONDUCTOR FABRICATION

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to increasing the efficiency of semiconductor wafer processing and microchip fabrication systems, and more particularly to introducing equipment and methods for utilizing the various semiconductor wafer's idle time during processing, to collect information about them. This addresses a solution to the technical problem of lengthy microchip production times by improving an existing technological process.

BACKGROUND

The process of fabricating microchips from an array of electrical circuits placed on top of a semiconductor wafer, is a complex technical operation that involves extensive handling of the wafer as it moves sequentially through a host of different fabrication stations. On average, a wafer is processed by 65 different machines as the microscopic circuit patterns are built on multiple layers of various materials, and only after these steps have been repeated hundreds of times, is the microchip finally completed.

To make microchips, semiconductor wafers have successive layers of different electrical circuits affixed to their planar faces. This is done through a plethora of cycles including all or some of these steps: polishing, edge zone marking, oxidation, photolithography, etching, deposition and ion implanting, contact hole formation, metal interconnect, dicing and electrical die sorting and testing. Interspersed among these steps is the metrology analysis and tracking.

The semiconductor fabrication process is slow as the wafers must be handled through numerous Equipment Front End Modules (EFEM) which pass the wafers through to the various other processing modules. An EFEM is the mainstay of semiconductor automation, shuffling silicon wafers between ultra-clean storage carriers and a variety of processing, measurement and testing modules. EFEM's access the wafers via a stacked cassette style wafer carrier, that manually is entered into a rack in a front opening universal port (FROUP). Each EFEM generally handles one or two wafers at a time which are robotically and precisely moved in and out of these wafer carriers. After the EFEM robotic wafer handler transfers these wafers to a process module, the remainder of the wafers sit idle in the wafer carrier in the FROUP. Between the processings coordinated from the various EFEM units, the wafer carriers with their multiple wafers, are transported to different metrology test units to map and test the wafers at their various stages of processing before moving on to another EFEM. The metrology steps are time consuming but necessary.

Henceforth, an EFEM that would speed up production and provide more data and better tracking of the wafers during processing, would fulfill a long felt need in the microchip fabrication industry. This new invention utilizes and combines known and new technologies in a unique and novel configuration to overcome the aforementioned problems and accomplish this.

BRIEF SUMMARY

In accordance with various embodiments, a Smart EFEM, integrating different metrology modules and techniques therein the EFEM, and interspersed between the wafer's process flow to obtain data about the wafer such as flatness, surface defects, film thickness, uniformity and edge/bevel/front/back inspection is provided. By doing this, metrology need not occur after the wafers have gone through a processing module. It is done simultaneously along with throughput semiconductor wafer tracing. This is a step forward in yield enhancement for Si wafers in production, as it utilizes the previous down time of wafers in the wafer carriers (but not yet into the process flow), to perform metrology data collection and tracking.

In one aspect, a metrology module and analysis module added into the EFEM, along with a dedicated larger metrology platter and a robotic wafer handler (preferably with dual robotic arms) for the movement of wafers (waiting to be injected into the process flow) on and off the large diameter metrology platter wherein the collection of measurement data and tracking data can occur.

In another aspect, a semiconductor processing front end module equipped with a novel metrology technique that uses the rotation of structured light between the metrology module and the semiconductor wafer, to allow inspection of the wafer's surface contamination, flatness uniformity, film thickness, 2D and 3D topography.

Various modifications and additions can be made to the embodiments discussed without departing from the scope of the invention. For example, while the embodiments described above refer to particular features, the scope of this invention also includes embodiments having different combination of features and embodiments that do not include all of the above described features.

BRIEF DESCRIPTION OF THE DRAWINGS

A further understanding of the nature and advantages of particular embodiments may be realized by reference to the remaining portions of the specification and the drawings, in which like reference numerals are used to refer to similar components.

DETAILED DESCRIPTION

Figure 1:
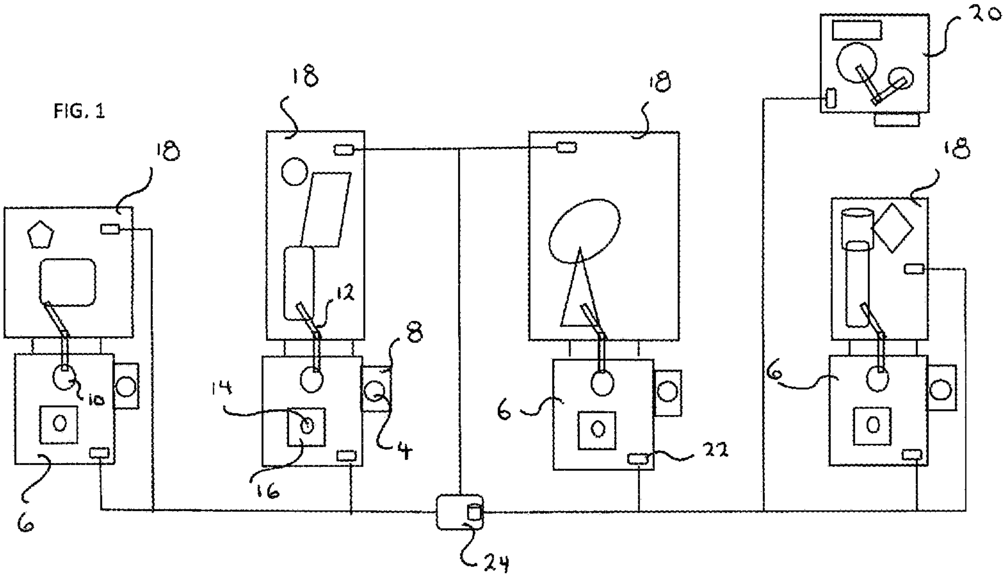
FIG. 1 is a diagrammatic top view of a prior art generic semiconductor processing facility.

Reference will now be made in detail to embodiments of the inventive concept, examples of which are illustrated in the accompanying drawings. The accompanying drawings are not necessarily drawn to scale. In the following detailed description, numerous specific details are set forth to enable a thorough understanding of the inventive concept. It should be understood, however, that the embodiments described are provided for illustrative purposes and are not intended to limit the scope of the invention.

It will be understood that, although the terms first, second, etc. may be used herein to describe various elements, these elements should not be limited by these terms. These terms are only used to distinguish one element from another. For example, a first attachment could be termed a second attachment, and, similarly, a second attachment could be termed a first attachment, without departing from the scope of the inventive concept.

It will be understood that when an element or layer is referred to as being "on," "coupled to," or "connected to" another element or layer, it can be directly on, directly coupled to or directly connected to the other element or layer, or intervening elements or layers may be present. In contrast, when an element is referred to as being "directly on," "directly coupled to," or "directly connected to" another element or layer, there are no intervening elements or layers present. Like numbers refer to like elements throughout. As used herein, the term "and/or" includes any and all combinations of one or more of the associated listed items.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically The terms "semiconductor and microchip, semiconductor chip, chip and integrated circuit (IC)" are used interchangeably herein. Integrated circuits are built out of an array of circuits (including but not limited to transistors, diodes, resistors, and capacitors) fabricated on top of a semiconductor, generally on a 150, 200 or 300 mm Si wafer that is diced to yield the individual microchips. These microchips perform logic operations and store data-generally handling all the processing tasks of most consumer computers. There are numerous integrated circuits put on a semiconductor wafer which is diced into numerous smaller components. These smaller diced sections of the semiconductor wafer are commonly called semiconductors, microchips, chips or integrated circuits. These terms are used interchangeable herein.

As used herein, the term "EFEM" refers to an Equipment Front End Module which is the mainstay of semiconductor automation, shuffling silicon wafers between ultra-clean wafer carriers and a variety of processing, measurement and testing modules. The EFEM has one or more load ports, pre-aligners, buffer modules, robotic wafer handlers, and computing modules for analysis, data storage and data transfer.

As used herein, the term "wafer carrier" refers to any device that stores multiple wafers and is able to be inserted into a loading port of an EFEM for eventual distribution of the individual wafers, via the robotic wafer handler, into the semiconductor fabrication stream via the pre-alignment module.

As used herein the term "interferometer metrology" is a method of metrology that superimposes two or more sources of light to create an interference pattern, which can be measured and analyzed to detect thickness variances or minute imperfections in the topography of the spectral surface of the semiconductor wafer extremely small measurements made Interferometry can quickly discern parallelism and unintended thickness pattern changes in wafers or layers added to wafers. These patterns can then be measured and analyzed to ensure they are within the specifications of the manufacturing process.

As used herein, the term "ellipsometer metrology" refers analysis of the wafers using a device that measures a change in polarization, represented as an amplitude ratio and the phase difference, as light reflects or transmits from a test sample. This is compared to a model. The measured response depends on optical properties and thickness of the test sample. Ellipsometry is primarily used to determine film thickness and optical constants, however, it is also applied to characterize composition, crystallinity, roughness, doping concentration, and other material properties associated with a change in optical response.

As used herein, the term "bright field microscopy" is microscope analysis of a wafer where the wafer is illuminated with white light from below and observed from above. In this analysis, contrast is generated in the wafer by attenuation of the transmitted light in dense areas of the wafer. Bright-field microscopy is the simplest of a range of techniques used for illumination of samples in light or electron microscopes, and its simplicity makes it a popular technique. The typical appearance of a bright-field microscopy image is a dark sample on a bright background, hence the name.

As used herein, the term "dark field microscopy" is an analysis of a wafer using a light or electron microscope to view the structures of the wafer with the white light illumination background so as to present a greater contrast when imaging. Generally, an opaque disc is placed underneath (downstream of) the condenser lens, so that only light scattered by irregularities on the wafer is seen. Instead of coming up through the specimen, the light is reflected by irregularities on the wafer. Thus, the wafer is illuminated with light that will not be collected by the objective lens and thus will not form part of the image. This produces the classic appearance of a dark, almost black, background with bright objects on it.

As used herein, the term "metrology" means the science of measurement. In the context of semiconductor manufacturing, metrology refers to various quality assurance scientific devices and methods used to measure the tolerances, structural deviations and dimensions of the SI wafer as it is built into a microchip.

As used herein, the term "specular surface" means a type of surface with a reflectance often described as a mirror-like reflection of light from the surface. In specular reflection, the incident light is reflected into a single outgoing direction as the angle of incidence equals the angle of reflection. Semiconductor flatness and surface roughness measurements may be determined by the reflection (concentrated or diffuse) of an incident light beam.

As used herein, the term "wafer" refers to a thin slice of a semiconductor material such as pure Silicon (generally from a cylinder configured with a diameter of 150, 200 or 300 mm). They are also known as a CPU wafers, or silicon wafers, and are used as the starting point for the production of central processing units (CPUs) and other microchip integrated circuits. These wafers are highly polished so as to have a specular surface.

As used herein, the term "structured light" refers to one or more lines of variable (i.e. controlled) width, pitch, and wavelength which will cover a predefined area. It will be referred to as the Light Frame of Reference (LFOR) and has a central axis about which it can be rotated. The light is selected from a group of light emitting devices consisting of the following: a light emitting diode (LED), a laser and a filament source.

As used herein, the term "image capture data array (ICDA)" refers to the image capture data measured by a sensor from the reflection of structured light that was projected onto a test sample at one or more locations. If the structured light was rotated when it was projected and this rotational rate synchronized with the data capture rate, an ICDA cube of information will be developed. Computer algorithmic analysis of this ICDA cube will reveal the geometric distortions of the test sample.

As used herein, the term "ICDA optical sensor refers to an array of more than one optical sensor selected from the group consisting of a CMOS sensor, a photodetector, a photomultiplier tube (PMT) and a charged coupled device (CCD).

As used herein, the term "wafer pre-aligner" (pre-aligner) means a mechanical device that accurately positions and aligns semiconductor wafers between their transfer from the wafer carrier to the semiconductor fabrication process equipment. Generally, thus is done referencing an edge zone flat spot put on the edge of the wafer. This ensures that the wafer, is properly oriented and positioned precisely on the piece of semiconductor fabrication equipment in the semiconductor production modules, so that the integrated circuits are built up correctly and with minimal defects. Metrology testing in the Smart EFEM occurs on the platter of the pre-aligner.

As used herein, the term "robotic wafer handler" is a computerized robotic device designed to automate and facilitate the handling of silicon wafers during the semiconductor manufacturing process. Wafer handlers shuttle semiconductor wafers between wafer carriers in the loading ports of the EFEMs, pre-aligners, and the semiconductor processing tools in the production modules, where various manufacturing tasks throughout the semiconductor production lifecycle are completed. Automated wafer handling systems can be found throughout various Back End of Line (BEOL) or Front End of Line (FEOL) manufacturing processes as the robot wafer handler facilitates the transfer of wafers between process tools.

As used herein the term "metrology module" refers to an assembly of metrology components to examine and analyze a wafer, that is generally positioned above the metrology plater on the pre-alignment module. It may include more than one metrology device chosen from the group of metrology devices consisting of dark field, bright field, ellipsometry, interferometry, intensity, phase, and 2D/3D measurement devices. It shares its data (which may be analyzed with its own analysis computing device or may be just raw metrology data) with a localized computing device communicates this data to the semiconductor processing system's operational mainframe computer.

As used herein, the term "metrology device" refers to a measuring system of components that examine and analyze wafers for identification (tagging) as well as film thickness, surface topography, defects, dimensions and tolerances and other critical parameters that affect the operation of a semiconductor.

As used herein "sequencing unit" refers to an electronic device that coordinates the transfer of wafers about the EFEM and the semiconductor processing module, and initiates and directs the operation of the pre-alignment module and the operation of the metrology module.

It takes over 65 pieces of specialized equipment to make a microchip from a SI wafer. The non-contact measurement of silicon wafers is critical for ensuring accurate thickness, topography, of these components. Defining and obtaining accurate thickness measurements are essential for reducing anomalies in patterning and packaging problems during semiconductor fabrication. Similarly, detecting anomalies in the spectral surface and built up integrated circuits is critical for quality control and correction of processing operations.

The present invention relates to a novel modified Smart EFEM with a wafer loading port, an integrated metrology module containing, at least one metrology device and analytics module, a pre-alignment module, a robotic wafer handler, at least one localized computing device, an optional rotational motor coupled to the pre-alignment module, and a sequencing module and its method of use. The Smart EFEM has its own pre-aligner with a large diameter metrology platter replacing the standard positioning platter (AKA chuck). The metrological device is chosen from the group consisting of dark field, bright field, ellipsometry, interferometry, intensity, phase, and 2D/3D measurement devices. This Smart EFEM can conservatively cut the processing time of a semiconductor chip by 20%.

Figure 2:
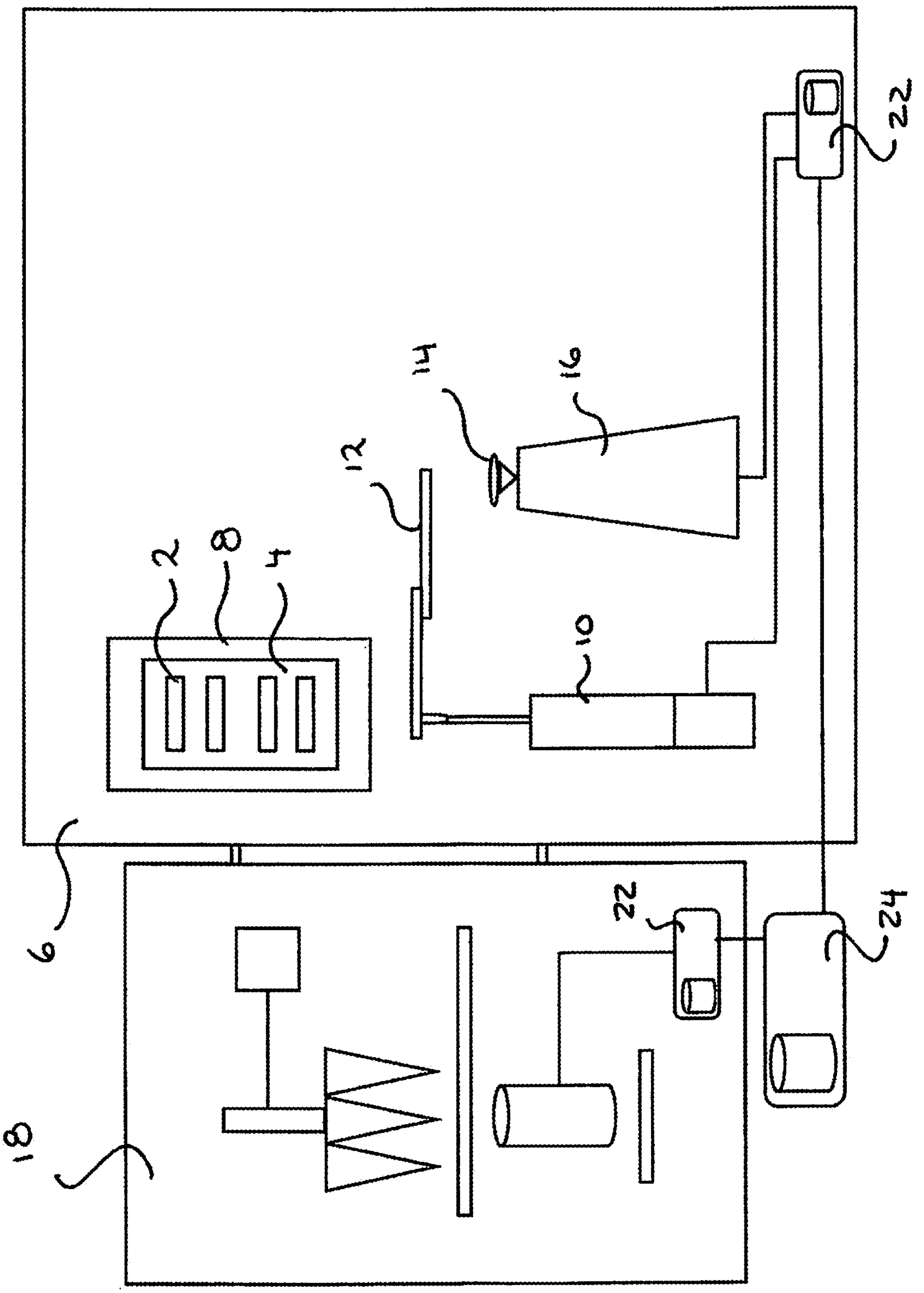
FIG. 2 is a diagrammatic side view of a prior art generic EFEM integrated with a generic single semiconductor processing module.

Looking at FIGS. 1 and 2, (which represent pre-existing art) it can be seen that in the conventional processing of Si wafers, a series of coded semiconductor wafers 2 are loaded into a wafer carrier 4 known as a FOUP (Front Opening Universal Port), FOSB Box (Front Opening Shipping Box), SMIF Pod (Standard Mechanical Interface Pod), Open Cassette, or Coinstack Horizontal Wafer Stacker. These wafer carriers 4 are loaded into an EFEM 6 which is a standardized interface via its loading port 8. A robotic wafer handler 10 with at least one moveable arm 12 with end effectors, extracts the wafers 2 from the wafer carrier 4 and manually places them onto a chuck (platter) 14 of a pre-aligner 16 where they are accurately indexed to the proper orientation and location to enter that specific semiconductor processing module 18 to build that portion of the integrated circuits on the wafer 2.

During the time these wafers 2 are having their integrated circuits built on them, the remainder of the wafers 2 in the wafer carrier 4 remain idle. Once all of the wafers 2 have been processed and are back in the wafer carrier 4, the wafer carrier 4 is manually removed from the loading port 8 of the EFEM 6 and put into a metrology module 20 for wafer testing/analyzing and tracking. After this is completed, the wafer carrier 4 of tested/analyzed and tracked wafers 2 are removed from the metrology module 20 and loaded into the next EFEM 6 coupled to the next sequential semiconductor processing module. Throughout this production, localized computing devices 22 track the wafer's ID and the metrology data of each wafer 2 and communicate this to the system's operational mainframe computer 24.

The time that it takes to complete this semiconductor processing flow and fully dice the wafers 2 into microchips is lengthy. Since only one or a few of the wafers 2 are processed at a time, the bulk of the wafers 2 remain idle in the wafer carrier 4 in the loading port 8 of the EFEM 6. This is wasted time in an already lengthy process. There is too much idle time for the wafers when being processing via a conventional EFEM 6. This time could be used to gather metrology and tracking data about individual wafers 2 so they could proceed directly between semiconductor processing modules 18, bypassing any intermediary metrology module 20.

Herein is disclosed a device and method to increase the overall output of semiconductor production facility as well as enhance the physical data and mapping of the semiconductor wafers fabricated therein. It accomplishes this by integrating novel high-speed metrology equipment and methods, and multiple metrology devices into the production process stream at the entry EFEM, so as to test and map the wafers 2 while they are sitting idle in the wafer carrier 4.

Figure 3:
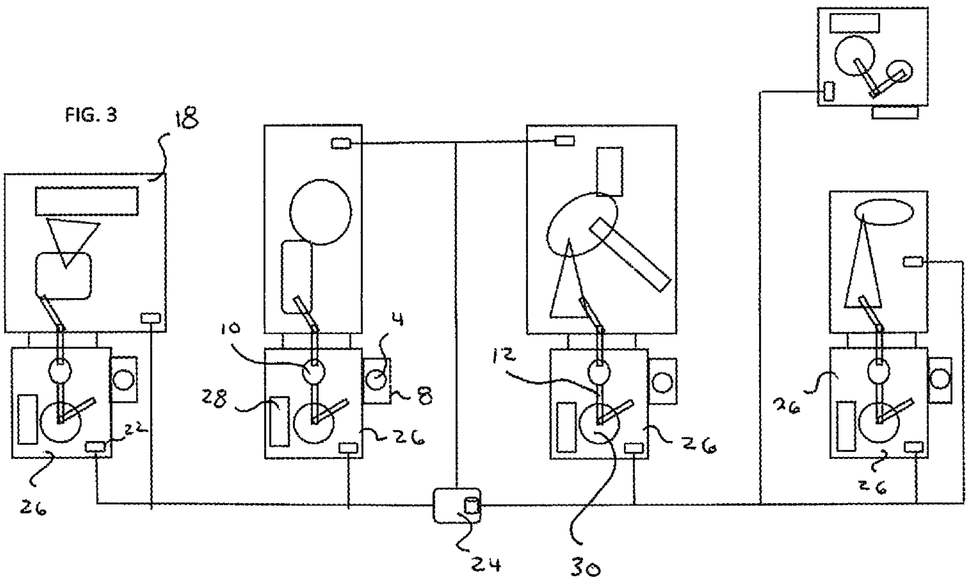
FIG. 3 is a diagrammatic top view of the smart EFEM integrated into a generic semiconductor processing facility.
Figure 4:
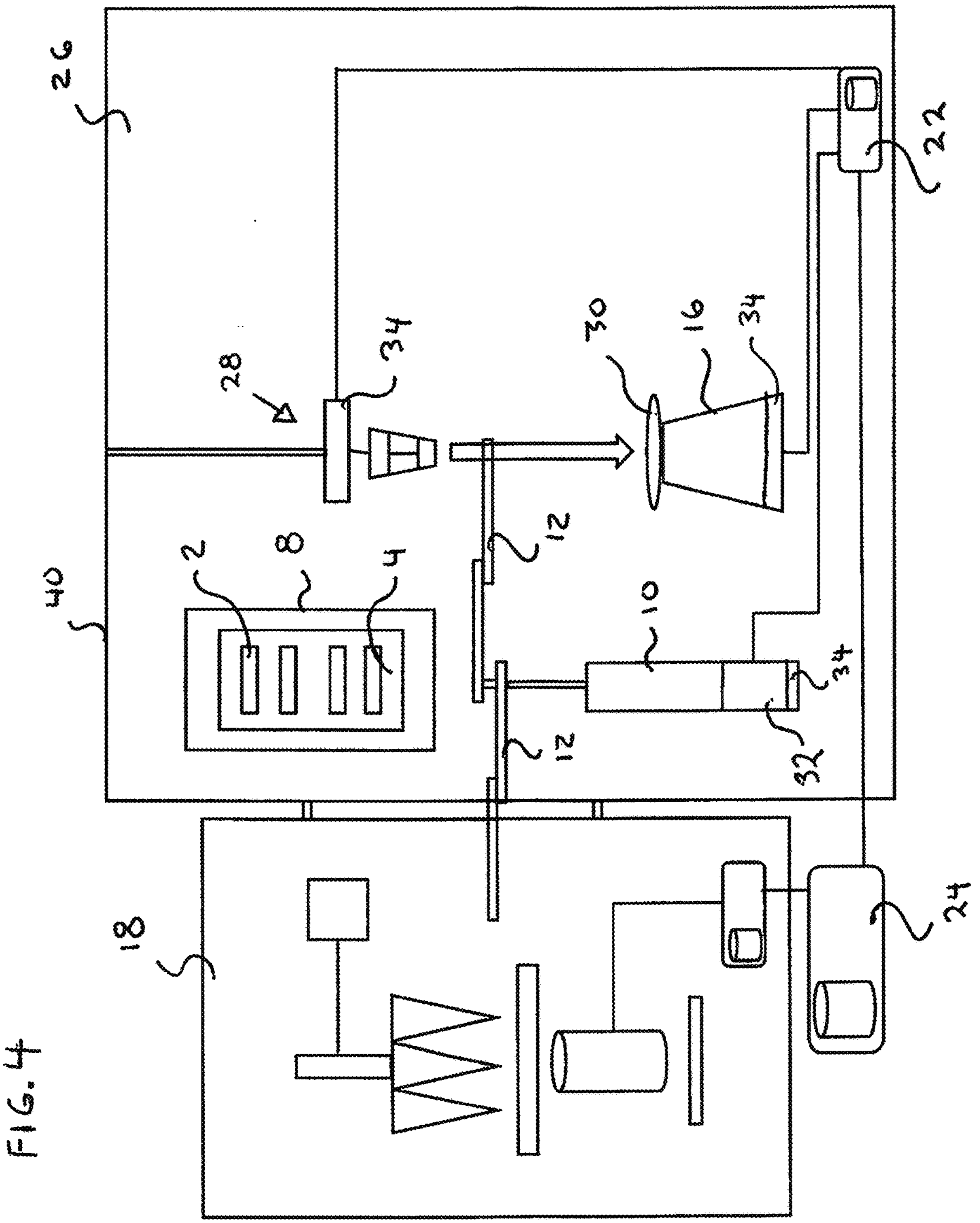
FIG. 4 is a diagrammatic side view of the preferred embodiment Smart EFEM integrated with a generic single semiconductor processing module.

Looking at FIGS. 3 and 4, the Smart EFEM can best be explained. Here a Smart EFEM 26 is a dust-proof walled enclosure 40 that can be seen integrated with a semiconductor processing module 18, wherein a metrology module 28 is located above a pre-alignment module 16 that has been coupled to a large diameter metrology plater 30. (Here, large indicates it is larger in diameter, or at least the equivalent in diameter, as that of the Si wafer 2 the robotic arm 12 places on the metrology platter 30, so as to support the wafer 2 in its entirety and eliminate metrology errors in the wafer's flatness and other measurements.)

Preferably, there is also a second robotic arm 12 on the robotic wafer handler 10 so that wafers 2 can be simultaneously shuttled between the wafer carrier 4 and the pre-alignment module 16; the pre-alignment module 16 and the semiconductor processing module 18; the semiconductor processing module 18 and the wafer carrier 4; and the pre-alignment module 16 and the wafer carrier 4. There is a sequencing module 32 that coordinates the shuffling of the unprocessed wafers 2 between the wafer carrier 4 and the per-alignment module 16 for metrology testing while the processed (or to be processed) wafers 2, are shuttled between the wafer carrier 4 and the pre-alignment module 16; the pre-alignment module 16 and the semiconductor processing module 18; and the semiconductor processing module 18 and the wafer carrier 4. The sequencing module 32 is responsible for coordinating the movement of the wafers from the wafer carrier 4 going to be processing and the wafers 2 from the wafer carrier 4, going for metrology testing.

The sequencing module 32 also directs the operation/actions of the metrology module 28 and the pre-alignment module. The metrology module 28, the sequencing module 32 and the pre-alignment module 16 all have operational computing units 34 (be it a microprocessor or computer) that communicate their data to a localized computing device 22 that is in data communication with the system's operational mainframe computer 24. This amalgamation of the operational computing units 34, the localized computing devices 22 and the operational mainframe computer 24 may be configured in a plethora of different ways, but the interconnective grouping of these, forms the analysis and processing network. The operational mainframe computer 24 houses all the history of each SI wafer including its fabrication data, its testing data, and its location data.

With the metrology of the idle wafers 2 done at each EFEM while IC fabrication is occurring on one or a few of the remaining wafers 2, there is no need to send the wafer carrier 4 to a metrology module 20 between the successive semiconductor processing modules 18.

In operation, the Smart EFEM 26 accepts the manual insertion of a set of wafers 2 arranged in a wafer carrier 4, into its loading port 8, located on the outside of one of the walls of the EFEM enclosure 40. The sequencing module 32 signals the robotic wafer handler 10 to manipulate one of its robotic arms 12 to withdraw the first wafer 2 from the wafer carrier 4 and place it on the metrology platter (chuck) 30 of the pre-alignment module 16. The sequencing module 32 also initiates the pre-alignment module to identify the wafer and correctly oriented it for insertion into a semiconductor wafer processing module 18. Its location and identification data is sent from the pre-alignment module's operational computing unit 34 to the semiconductor processing system's operational mainframe computer 24 (directly or via the localized computing device 22) where it is stored. It may also optionally be examined by the metrology module 28 if it is the first wafer out of the wafer carrier.

The sequencing unit also initiates the metrology examination. Note that subsequent wafers 2 from the wafer carrier 4, will not have their processing immediately after their metrology examination. Any metrology data (analyzed or in raw data form) from the metrology module is sent by the metrology module's operational computing unit 34 to the localized computing device 22 for storage, analysis and or transfer. This analyzed metrology data is transmitted to the semiconductor processing system's operational mainframe computer 24.

Upon completion of the metrology examination (which is not optional, just optional at this time for the first wafer), the sequencing module 32 signals the robotic wafer handler 10 to manipulate one of its two robotic arms 12 to remove the first wafer 2 in its correct physical orientation and transfer it to a semiconductor wafer processing module 18. The sequencing module signals the semiconductor processing module to begin its processing.

While the processing of the first wafer is underway, the sequencing module 32 signals the robotic wafer handler to use one of its two robotic arms 12 to shuttle the other idle wafers 2 (one at a time) between the wafer carrier 4 and the pre-alignment module 16. When these idle wafers 2 (not yet into the semiconductor process flow) are individually placed on the metrology platter 30, the sequencing module 32 signals the metrology unit 28 to identify and examine the wafer 2, sending its metrology data to the semiconductor processing system's operational mainframe computer 24 via localized computing devices 22 of the metrology module 28. The sequencing module 32 then signals the robotic wafer handler 10 to use its robotic arms 12 to return the now metrologically examined wafer back to the wafer carrier 4. The time to process a wafer exceeds the time to metrologically examine a wafer 2, so the wafers lying idle in the wafer carrier 4 will continue to be examined one by one between processing of the wafers in the semiconductor processing module 18 until a wafer is finished processing.

The examination of the idle wafers 2 will continue sequentially through the wafers loaded in the wafer carrier 10, however the sequencing module sets an operational priority wherein wafer processing takes priority to metrology examination. After processing of this first wafer 2 has been completed, the sequencing module 32 signals the robotic wafer handler 10 to manipulate one of its two robotic arms 12 to transfer the processed first wafer from the semiconductor processing module 18 back to the wafer carrier 4. (Each wafer, examined or not, will be placed onto the pre-alignment module prior to entering a semiconductor wafer processing module 18.) The sequencing unit now selects the next sequential unprocessed wafer as per its priority, and as soon as the idle wafer currently on the pre-alignment module is finished with its metrology examination The sequencing repeats the steps of shuttling the wafers between the wafer carrier 10 and the pre-alignment module 16, following the priority rules, until all the wafers 2 in the wafer carrier 4 have been identified and analyzed for structural anomalies. After all the wafers have been examined, only the production sequencing will remain.

It is to be noted that in the sequencing, the wafer's processing takes priority over the wafer's examination because processing is a much lengthier process. In this manner the time the wafers spend in a Smart EFEM is identical to the time the wafers spend in a conventional EFEM except the metrology of all the wafers in that wafer carrier is completed and there need not be a separate step where the wafer carrier is sent to a metrology module. Rather, the wafer carrier may be transferred to the next Smart EFEM and semiconductor processing module.

It is also to be noted, that the sequencing may occur in the reverse order, where the metrology examination may be performed on the wafers that have been returned to the wafer carrier after they have been processed.

Figure 7:
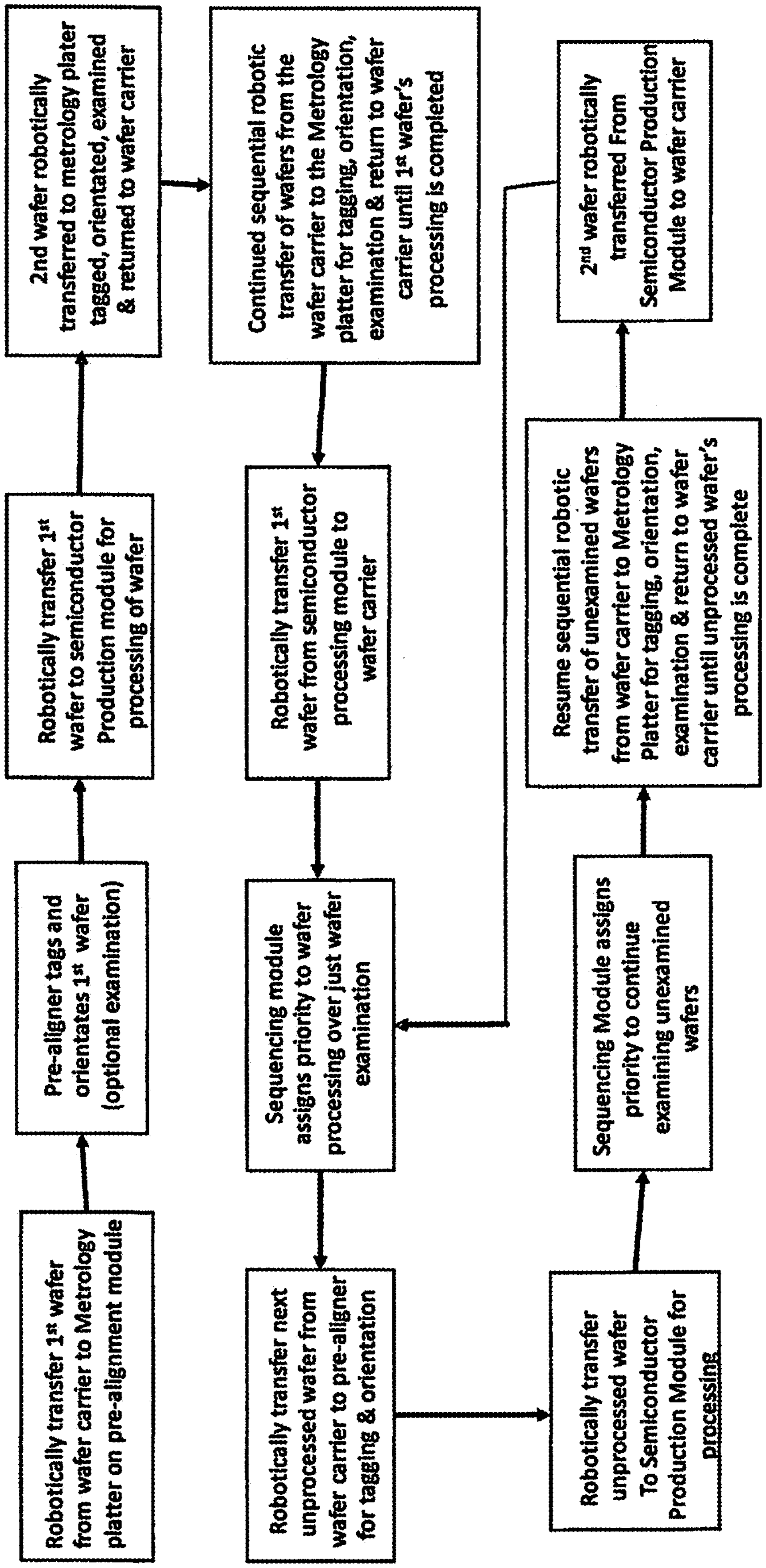
FIG. 7 is a flow chart showing the steps the sequencing module performs in the EFEM when processing a semiconductor wafer.

FIG. 7 illustrates the sequencing method steps of the Smart EFEM to process and to examine the wafers. As can be seen, once the wafer carrier 4 is loaded into the loading port 8 the sequencing module 32 signals the robotic wafer handler 10 to use its robotic arms 12 to load wafers 2 onto the metrology platter 30 of the pre-alignment module 16. This loading will be for either of two purposes: tagging, orientation, and semiconductor processing, or tagging, orientation, metrology examination and return to the wafer carrier to await semiconductor processing. A wafer 2 will always have to undergo tagging and orientation each time it is moved onto the metrology platter 30 so the microprocessors and computing devices know the identity/location of the wafer as well as to ensure the wafer 2 is in the precise proper location for the next step, be it processing or examination.

Figure 8:
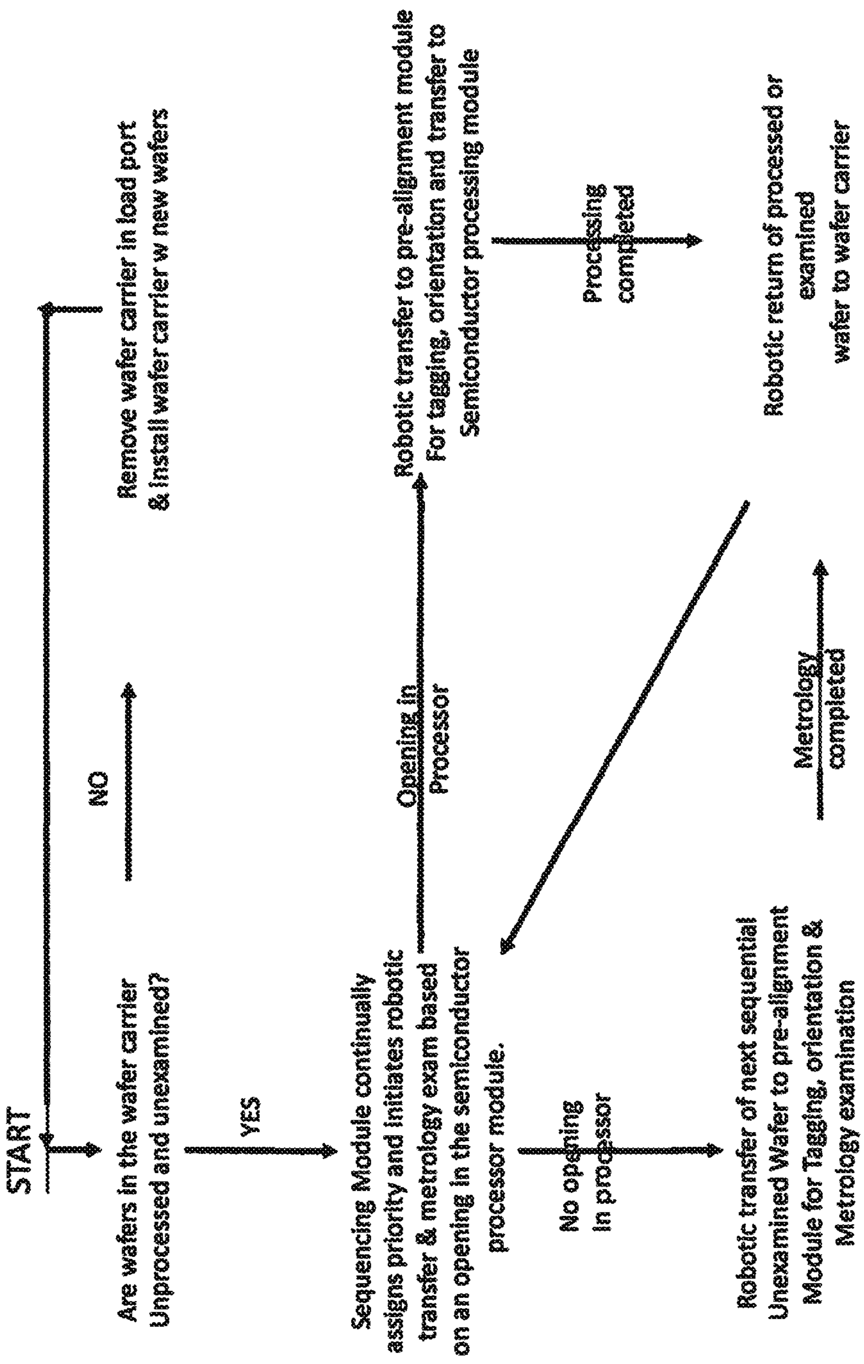
FIG. 8 is a flow chart showing the logic steps the sequencing module performs in coordinating the processing and metrology examination of semiconductor wafers.

It is to be noted, that there may be more than one set of logic instructions for the sequencing module 32. In the way of a first example, the first wafer may have a full metrology examination when placed on the platter 30 before being shuttled to the semiconductor processing module. The sequencing module then sequentially sends wafers 2 to the metrology plater 30 based on the following priority: wafers to undergo processing with an open availability in the semiconductor processing module first, wafers just undergoing metrology examination second. FIG. 8 shows the priority rules of the sequencing module of the Smart EFEM.

The actual set of logic instructions will be time optimized and vary based on the length of the time the metrology examination/s take, and the length of time the wafer processing takes. Either way, since there are generally only one or two wafers able to be processed at any time and the time to metrologically examine a wafer is much shorter. There will be numerous idle wafers that are metrologically examined between wafer processing.

Figure 5:
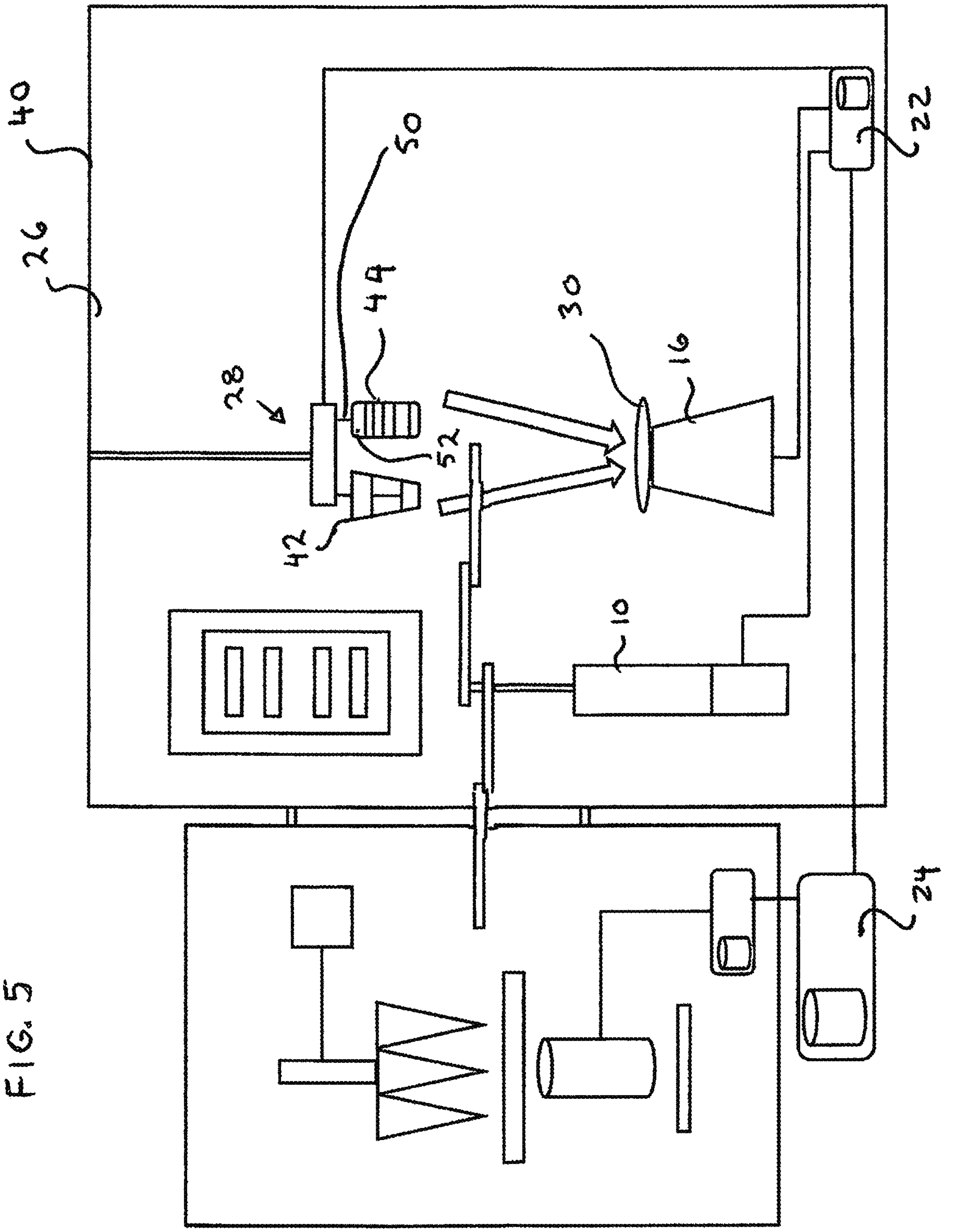
FIG. 5 is a diagrammatic side view of the first alternate embodiment Smart EFEM integrated with a generic single semiconductor processing module.
Figure 6:
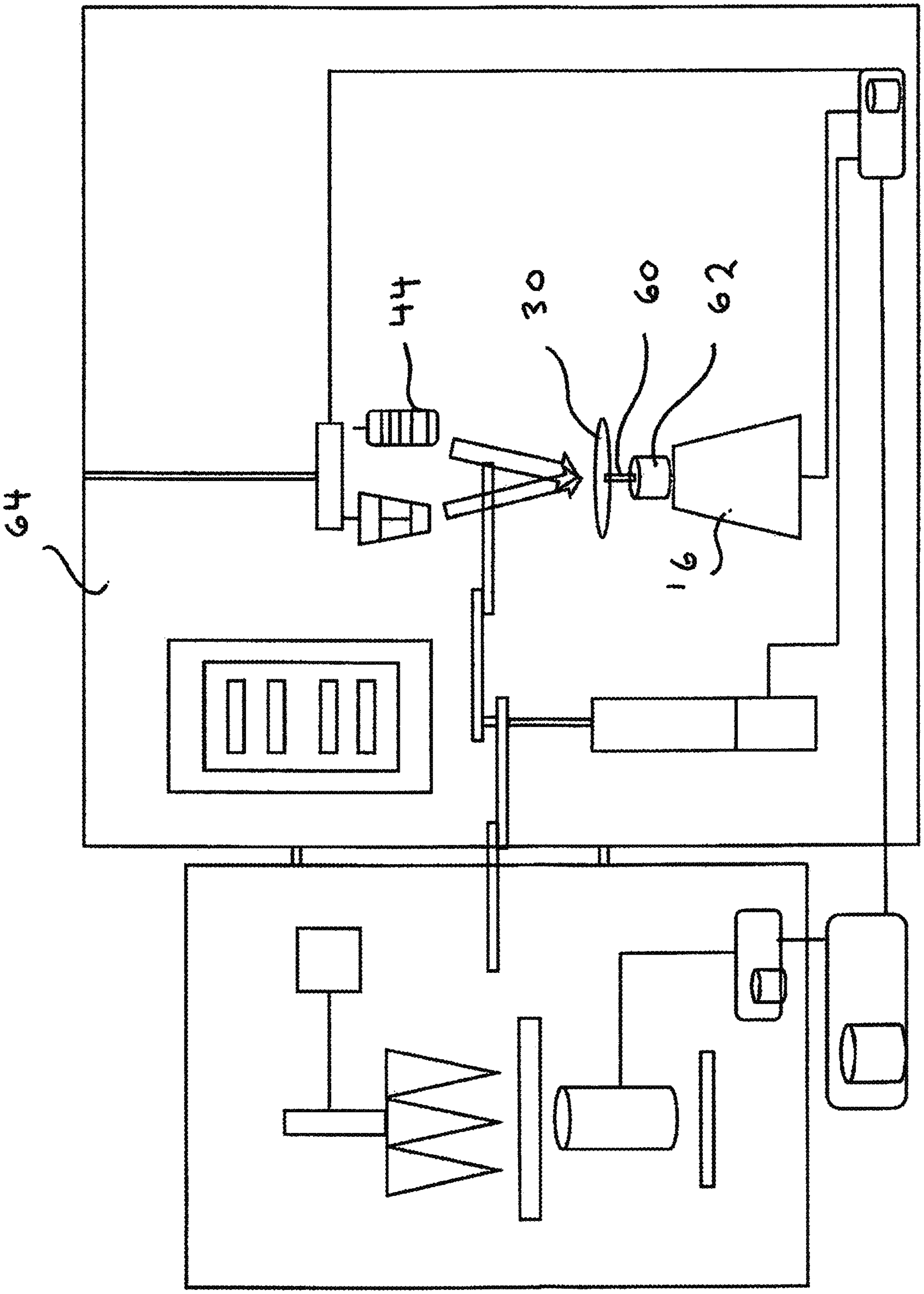
FIG. 6 is a diagrammatic side view of a second alternate embodiment Smart EFEM integrated with a generic single semiconductor processing module.

Looking at FIGS. 5 and 6, alternate embodiments of the Smart EMEF 26 can be seen. In the first alternate embodiment of FIG. 5 the Smart EMEF 26 has multiple metrology testing devices 42 in its metrology module 28 combined to perform various types of wafer analysis. These individual metrology testing devices 42 are selected from the group of metrology devices consisting of dark field metrology, bright field metrology, ellipsometry metrology, interferometry metrology, photoluminescence metrology, magnetometer metrology, profilometer metrology, X-ray diffractometer metrology, resistance metrology, high-energy electron diffraction metrology and heterodyning optical phase (structured light) metrology as specified in U.S. Pat. Nos. 10,627,223 and 11,193,759 to Darwin an incorporated herein by reference. If the metrology testing device 42 includes structured light metrology, there will be an axis 50 that the device is rotated about by a motor 52.

In the second alternate embodiment of FIG. 6 the Smart EMEF 64 also has multiple metrology testing devices 42 in its metrology unit 28 combined to perform various types of wafer analysis as the first embodiment does, but here the wafer is rotated on the metrology plater 30, about its central axis 60 by a rotational motor 62 while the structured light metrology device 44 is held stationary.

The difference between the two preferred embodiments is that while the relative rotational motion between the structured light metrology device 44 and the wafer 2 on the metrology plater 30 remains identical, in one embodiment the rotation is by the metrology module 28 while in the other embodiment the rotation is by the pre-alignment module 16. This difference in the source of the relative rotation has no effect on the metrology analysis.

In the metrology module 28 there may be several different metrology devices as chosen for the defects under examination or the metrology data sought, however at a minimum the metrology testing device 42 integrated with the EFEM will have at least a structured light metrology device 44 as described in U.S. Pat. Nos. 10,627,223 and 11,193,759, by Darwin, and incorporated by reference herein. This type of metrology testing generates and projects structured light on the wafer and subsequently measures and analyses the projected light to produce three dimensional data.

The structured light will typically consist of one or more lines of variable (i.e., controlled) width, pitch, and wavelength, which will cover a predefined area and be referred to herein as the Light Frame of Reference (LFOR). Within the LFOR there will be defined a central axis, about which the LFOR may be rotated. One or more sensors, which may include, but not be limited to, a CCD array or camera, may measure the projected structured light on the sample at one or more locations and be referred to herein as the image capture data array (ICDA). Images/data may be captured as the LFOR is rotated, thus generating an ICDA cube (ICDAC) of information. The data capture rate and the LFOR rotation rate may be synchronized such that sufficient information is captured to satisfy Nyquist's Theorem for both spatial and temporal sampling.

A specified area that may include, but not be limited to, a single pixel in the ICDA may be analyzed through the ICDAC which amounts to tracing the information in this pre-defined area as a function of time and thus light intensity modulation. A null condition generally exists in an area about the central axis and can be removed by translating the LFOR, generating multiple LFOR's offset from one another, translating the wafer, or other approaches. For a flat surface, the spatial frequencies will typically all be the same and therefore may be used, though not required to be used, as a reference signal for each trace through the ICDAC.

A non-flat surface may contain multiple spatial frequencies, and thus will distort the structured light along the curvature of the surface. The amount of distortion is generally related to the displacement perpendicular to the incoming light. As the LFOR is rotated, the distortion manifests itself as a phase lag or lead in the ICDAC trace as compared to the reference flat surface. The relative phase compared to the reference for each trace in the ICDAC can be extracted through several methods including, but not limited to, time differencing, Lissajous analysis, product methods, Fourier analysis, phase locking methods, etc.

Given the modulated nature of the apparatuses, low level signals can be differentiated from back ground noise by using several different techniques, including time and frequency-based filtering, lock-in detections schemes, or other. Additionally, the wavelength of the light and the type of sensor can be adjusted to maximize not only the amount of reflected light but also the detector sensitivity to that wavelength of light.

Figure 9:
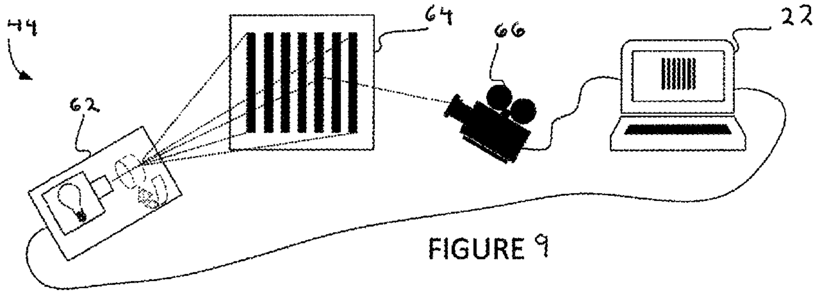
FIG. 9 is a first embodiment of the preferred metrology device.

FIG. 9 illustrates a first example of a high speed structured light metrology device 44 (as described in U.S. Pat. Nos. 10,627,223 and 11,193,759). In the example, the metrology device 44 includes a light source 62 capable of generating rotating, structured light that is projected onto a sample area 64. The structured light, as projected onto the sample area 64, may be measured by a first sensor 66. A second sensor may be used to measure the angular position of the structured light. The data from the first sensor 66 and the second sensor may be collected and passed to a localized computing device 22. The computing device 22 will have the ability to synchronize the angular position as measured by the second sensor with the data acquired by the first sensor 64. The computing device 22 may also be configured to store and analyze data and transmit metrology data to the system's operational mainframe computer 24 (FIG. 5)

Figure 10:
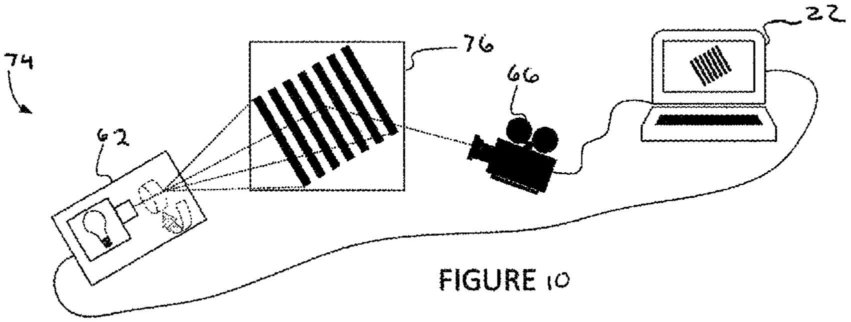
FIG. 10 is a second embodiment of the preferred metrology device.

FIG. 10 illustrates a second example of a high speed structured light metrology device 74. Similar to the system 44 of FIG. 9, the metrology device 74 includes a sample area 76, a light source 62, a first sensor 66, and a computing system 22. However, with regard to second system 74, the projected structured light has been shown to be rotated to an arbitrary angle with its subsequent data representation shown on the computing system 22. It will be appreciated that the structured light can be rotated to arbitrary, discrete angles or rotated continuously. Regardless, data from the first sensor 66 and the second sensor may be synchronized.

Figure 11:
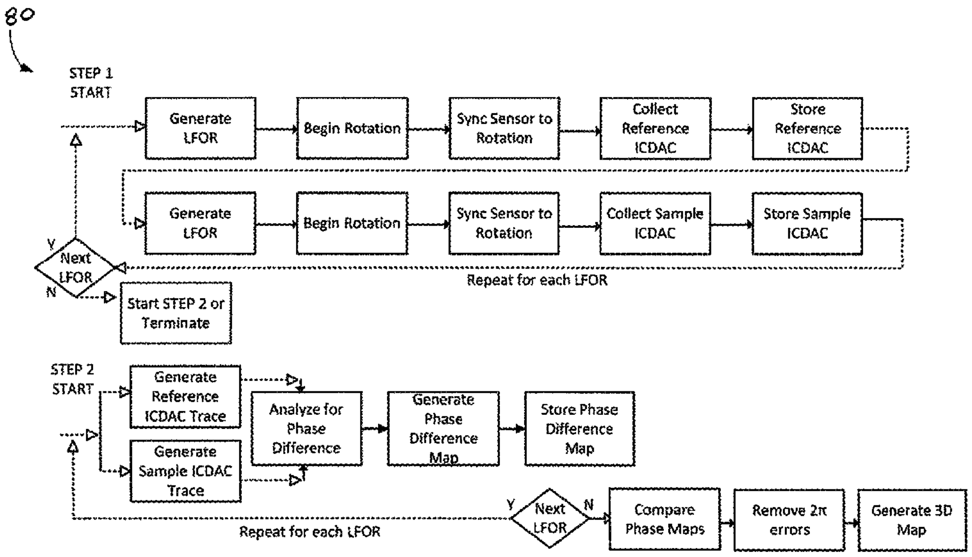
FIG. 11 is a first method for generating and analyzing data with the preferred metrology device.

FIG. 11 illustrates a first example of a method 80 for generating and analyzing data in accordance with certain implementations of the disclosed technology. In Step 1, the structured light (Light Frame of Reference, LFOR) is generated at certain angles, rotated, and synchronized with the sensor. Data is collected (Image Capture Data Array Cube, ICDAC) for both the reference and the wafer for each LFOR and stored for processing in Step 2. This process can be repeated for multiple LFOR or terminated after a single comparison.

In Step 2, ICDAC Traces (at each X,Y location in the sensor) may be extracted from the stored IDAC for both reference and sample and analyzed to extract the relative phase. The relative phase may be stored for each ICDAC trace to generate a phase map for each LFOR. Multiple Phase Maps may be compared to identify any phase wrapping errors, and identified errors may be corrected. Phase may be converted to 3D height map information based upon the LFOR reference calibration. Steps 1 and 2 may be done sequentially or in parallel.

Figure 12:
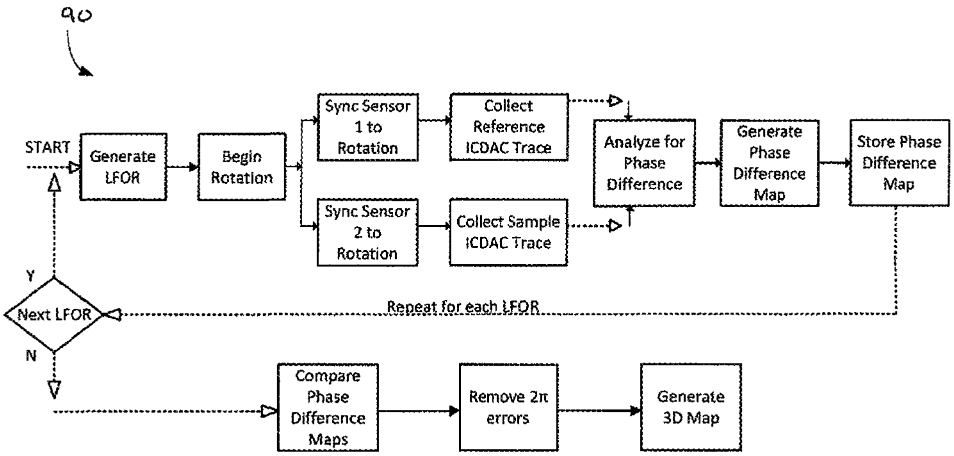
FIG. 12 is a second method for generating and analyzing data with the preferred metrology device.

FIG. 12 illustrates a second example of a method 90 for generating and analyzing data in accordance with certain implementations. In this alternative approach, the reference and wafer data may be collected and analyzed simultaneously. IDAC Trace analysis for relative phase may be done through software or through hardware.

Figure 13:
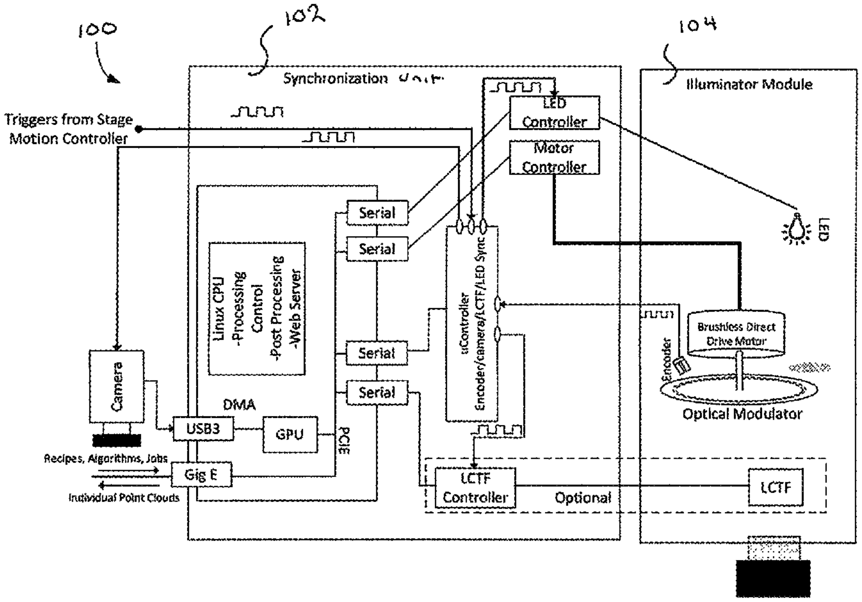
FIG. 13 is a functional diagram illustrating an embodiment of the preferred metrology device.

FIG. 13 is a functional diagram 100 illustrating an example of a measuring system in accordance with certain implementations. The example includes a synchronization unit 102 and an illuminator module 104.

Certain implementations generally include a large, diffusely scattering surface, e.g., to remove any hot spots or optical non-uniformity from the light source. The size of this surface is typically directly proportional to the size and curvature of the wafer, thus allowing all angles of the wafer surface to be illuminated simultaneously, e.g., without any hot spots. The wafer and the observing sensor may be geometrically configured such that the sensor may image the diffusely scattered, spatially modulated light form the wafer surface. This spatially modulated light can be transformed into phase and subsequently surface height.

A spatially modulated light source may be used, as well as a diffusely reflecting screen (e.g., having a flat or curved surface). The screen may be illuminated off axis. A wafer may be staged with automation to manipulate the wafer (e.g., by rotation). A sensor (e.g., an area scan camera) may have optics to image the surface of the wafer. The camera and optics may be set up in such a way to observe the diffusely reflected light form the wafer surface. Data may be collected in a first wafer orientation, the wafer may be rotated (e.g., at least 90 degrees), and data may be collected again. The wafer surface may be reconstructed from the phase measurements using known phase unwrapping algorithms, for example.

Figure 14:
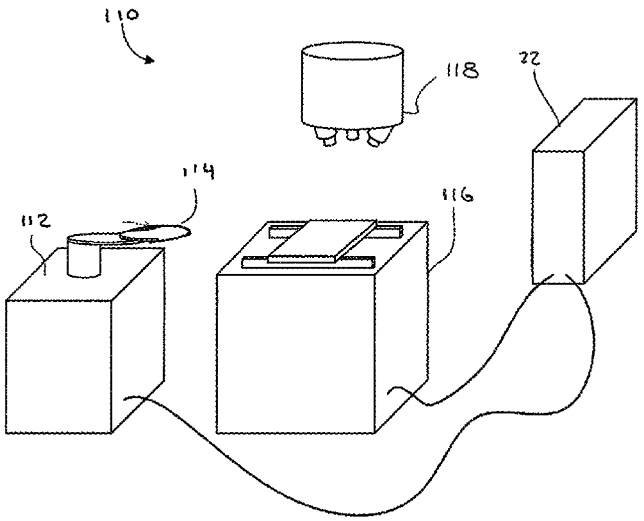
FIG. 14 is a third embodiment the preferred metrology device.

FIG. 14 illustrates a third example 110 of a measuring system in accordance with certain implementations. The system 110 includes a wafer positioning apparatus 112 configured to position a wafer 114. The wafer positioning apparatus 112 preferably will be a robotic arm or other automated apparatus having one or more axis for picking, placing, and/or aligning the wafer, for example. The system 110 also includes a pre-alignment module 114 that may have one or more axis for positioning the wafer 114 before and/or during the measurement. The system 110 also includes a metrology 2D/3D measurement apparatus 118 for measuring dimensions, topography, and characteristics of the wafer 114, for example. The system 110 also has a local computing device 22 that may be configured to synchronize motion, measurement, and/or analysis.

Figure 15:
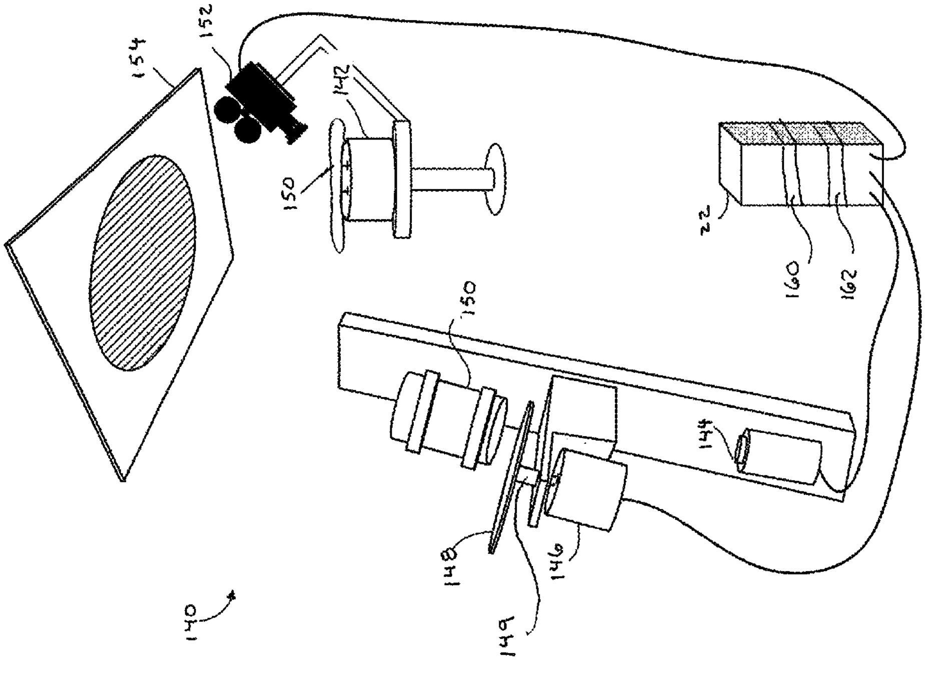
FIG. 15 is a fourth example of the preferred metrology device.

FIG. 15 illustrates a fourth example 140 of a measuring system in accordance with certain implementations. The system 140 includes a pre-alignment module 142, at least one light source 144, a motor 146, an optical modulator 148, a lens element 150, a first sensor 152, and a computing device 22. The system 140 also includes a projection surface 154 configured to receive projected light. The pre-alignment module 142 is generally configured to position a wafer 150.

In the example 140, the motor 146 is configured to rotate an axis 149 and the optical modulator 148 is coupled with the axis 149 and configured to be rotated by the axis 149. The motor 146 may be a brushless direct drive motor, a stepper motor, or a brush DC motor, for example, or any other suitable type of motor. In certain embodiments, the motor 146 may be configured to continuously rotate the axis such that the optical modulator 148 is continuously rotated by the axis 149.

The light source 144 is configured to shine light through the optical modulator 148 to project structured light onto the projection surface 154 through the lens element 150. The light source 144 may have projection optics that are capable of generating and rotating structured light, for example. In certain embodiments, the light source 144 may be selected from a group consisting of the following: a light emitting diode (LED), a laser, and a filament source.

In certain embodiments, the system has multiple light sources, including the light source 144, that are configured to eliminate any null conditions. These multiple light sources may be configured to shine light at different widths, spatial frequencies, and angle of incidence to extend dynamic range or eliminate phase errors.

In certain embodiments, the optical modulator 148 includes an encoder that is configured to cause a pattern to be created by the structured light that is shined by the light source 144 onto the projection surface 154. The projection surface 154 may be made of a material, e.g., a rough material, that is selected from a group consisting of the following: paper, metal, cardboard, cloth, fabric, and paint. The surface of the wafer 150 may be shiny, e.g., the wafer 150 may be made of Si.

In the example 140, an optical sensor apparatus includes at least the first sensor 152 and is configured to capture an image of the wafer 150 by diffused light that is reflected from the projection surface 154 and subsequently reflected from the wafer 150. The optical sensor apparatus may include an array of more than one sensor selected from a group consisting of the following: a CMOS sensor, a photodetector, a photomultiplier tube (PMT), and a charged coupled device (CCD). The surface of the wafer 150 may act to distort or deflect the structured light, and the sensor 152 may read this distorted light, for example.

The computing device 22 includes a synchronization module 160 that is configured to phase lock the system 140 by coordinating at least one light source 144 and the first sensor 152 and any other associated sensors. The computing device 22 further includes an analysis module 162 that is configured to compute a three dimensional (3D) object based on the received diffuse light that is reflected from the projection surface 154 and the wafer 150. The features of the 3D object may be related to the amount of light distorted by the wafer 150, for example.

In certain alternative implementations, the structured light that is projected onto the projection surface 154 may be projected from behind the projection surface 154 rather than from the front of the projection surface 154.

Figure 16:
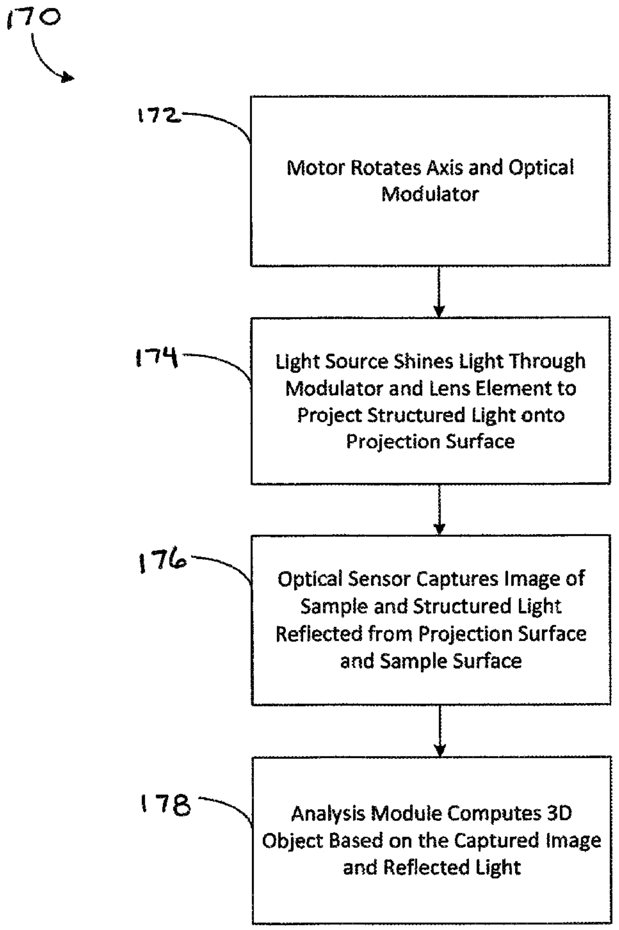
FIG. 16 is a method for generating and analyzing data with the preferred metrology device.

FIG. 16 illustrates an example of a computer-implement method 170 in accordance with certain implementations of the disclosed technology. At 172, a motor rotates an axis, causing an optical modulator that is coupled with the axis to rotate. In certain embodiments, the motor continuously rotates the axis such that the optical modulator that is coupled with the axis is continually rotated by the axis.

At 174, a light source shines light through the optical modulator to project structured light onto a projection surface through a lens element. The light source may include at least one selected from a group consisting of the following: a light emitting diode (LED), a laser, and a filament source. In certain embodiments, multiple light sources may shine light at a number of different widths, spatial frequencies, and angle of incidence to extend dynamic range or eliminate phase errors.

At 176, an optical sensor apparatus having at least one sensor captures an image of the sample and structured light that is reflected from the projection surface and the sample surface, which may be shiny. The projection surface may be made of a material that is selected from a group consisting of the following: paper, metal, cardboard, cloth, fabric, and paint, or any other suitable material.

In certain embodiments, the at least one sensor may be selected from a group consisting of the following: a CMOS sensor, a photodetector, a photomultiplier tube (PMT), and a charged coupled device (CCD).

At 178, an analysis module computes a three-dimensional (3D) object based at least in part on the structured light that is reflected from the projection surface and the sample surface.

While not illustrated by FIG. 16, it will be appreciated that the method 170 further includes a synchronization module phase locking the system by coordinating the light source and the at least one sensor. The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

In Summary, the process flow for semiconductor fabrication takes too much time to measure wafers in a separate metrology module. This Smart EFEM has increased robotic wafer handling capacity utilizing the high speed structured light metrology device 44 as described in U.S. Pat. Nos. 10,627,223 and 11,193,759. The pre-aligner chuck will be replaced with a special larger, metrology chuck and will have a metrology module positioned above the pre-alignment module which will be custom configurable according to the customer's metrology needs. This would enable high resolution data to be collected at every process step with no impact to processing cycle time. Surface contamination, flatness uniformity, film thickness, topography in three dimensions, two dimensional analysis and phase and intensity mapping can now all be measured from inside the Smart EFEM. This Smart EFEM will allow full wafer tracking throughout the entire fabrication process for every wafer.

This data will be uploaded into the customer central database and can be subjected to AI pattern analysis in order to diagnose issues in the process stream.

The invention claimed is:

1. A method to increase the overall output of semiconductor production facility as well as enhance physical data and mapping of Si wafers fabricated therein, using an equipment front end module (EFEM) with an integrated metrology unit therein, that is connected to a Si wafer processing module, comprising the steps of:

(a) inserting of a set of Si wafers arranged in a Si wafer carrier, into a loading port of said EFEM;

(b) transferring an unprocessed Si wafer from said Si wafer carrier to a metrology platter of a pre-alignment module;

(c) identifying and orienting said unprocessed Si wafer by said pre-alignment module for insertion into said Si wafer processing module;

(d) transferring said unprocessed Si wafer in its correct physical orientation from said pre-alignment module to said Si wafer processing module;

(e) initiating said unprocessed Si wafer's processing;

(f) transferring an unexamined Si wafer from said wafer carrier to said metrology platter of said pre-alignment module;

(g) identifying and orienting said unexamined Si wafer by said pre-alignment module;

(h) performing a metrology examination and developing metrology data of said unexamined Si wafer;

(i) transferring said examined Si wafer to said Si wafer carrier;

(i) repeating steps (g) to (i) if processing of said unprocessed Si wafer is not yet completed, but if processing of said unprocessed Si wafer is completed, proceed to next step;

(k) transferring said unprocessed Si wafer when finished processing, from said semiconductor processing module to said Si wafer carrier, and repeating steps (b) to (i) until all Si wafers in said Si wafer carrier have been processed and examined; and wherein said metrology examination is performed on idle wafers prior to processing, and wherein the sequencing module prioritizes processing while metrology on other wafers is concurrently being performed, thereby eliminating the need for a separate metrology module between processing steps.

2. The method to increase the overall output of semiconductor production facility as well as enhance physical data and mapping of the Si wafers fabricated, of claim 1, wherein said metrology unit is selected from the group of metrology devices consisting of dark field metrology, bright field metrology, ellipsometry metrology, interferometry metrology, photoluminescence metrology, magnetometer metrology, profilometer metrology, X-ray diffractometer metrology, resistance metrology, high-energy electron diffraction metrology and hetrodyning optical phase metrology.

3. The method to increase the overall output of semiconductor production facility as well as enhance physical data and mapping of the Si wafers fabricated, of claim 1, wherein said transferring is performed by a robotic wafer handler with at least one arm extendable between said SI wafer carrier, said pre-alignment module and said Si wafer processing module.

4. The method to increase the overall output of semiconductor production facility as well as enhance physical data and mapping of the Si wafers fabricated, of claim 1, wherein said pre-alignment module has a metrology platter connected thereto, said metrology platter having a planar face and a diameter exceeding a diameter of said Si wafer.

5. The method to increase the overall output of semiconductor production facility as well as enhance physical data and mapping of the Si wafers fabricated, of claim 1, wherein said metrology examination of said unexamined Si wafer obtains Si wafer metrology data from an edge, front face or back face of said Si wafer on said metrology platter and transfers said Si wafer metrology data to a computer module for an analysis, storage and transfer of semiconductor wafer metrology data.

6. The method to increase the overall output of semiconductor production facility as well as enhance the physical data and mapping of the Si wafers fabricated, of claim 5, wherein said robotic wafer handler has a sequencer unit coordinating the transfer of said Si wafers by said robotic wafer handler from the wafer carrier to the pre-alignment module and to either said Si wafer process chamber, or back to said wafer carrier from said pre-alignment module or said Si wafer process chamber.

7. The method to increase the overall output of semiconductor production facility as well as enhance physical data and mapping of the Si wafers fabricated, of claim 6, wherein said semiconductor wafer metrology data is selected from the group consisting of wafer flatness, surface irregularities, film thickness, surface uniformity and defectivity.

8. A method to increase the overall output of semiconductor production facility as well as enhance physical data and mapping of Si wafers fabricated therein, using an equipment front end module (EFEM) with an integrated metrology unit therein, that is connected to a Si wafer processing module, and a sequencing module, comprising the steps of:

(a) inserting of a set of Si wafers arranged in a Si wafer carrier, into a loading port of said EFEM;

(b) transferring an unprocessed Si wafer from said Si wafer carrier to a metrology platter of a pre-alignment module;

(c) identifying and orienting said unprocessed Si wafer by said pre-alignment module for insertion into said Si wafer processing module;

(d) transferring said unprocessed Si wafer in its correct physical orientation from said pre-alignment module to said Si wafer processing module;

(e) initiating said unprocessed Si wafer's processing;

(f) transferring an unexamined Si wafer from said wafer carrier to said metrology platter of said pre-alignment module;

(g) identifying and orienting said unexamined Si wafer by said pre-alignment module;

(h) performing a simultaneous metrology examination and developing metrology data of said unexamined Si wafer;

(i) transferring said examined Si wafer to said Si wafer carrier;

(j) repeating steps (g) to (h) if processing of said unprocessed Si wafer is not yet completed, but if processing of said unprocessed Si wafer is completed, proceed to next step;

transferring said unprocessed Si wafer when finished processing, from said semiconductor processing module to said Si wafer carrier, and repeating steps (b) to (i) until all Si wafers in said Si wafer carrier have been processed and examined;

wherein the sequencing module dynamically schedules wafer movement such that:

(i) a first wafer is processed in the processing module;

(ii) a second wafer, remaining idle in the wafer carrier, is simultaneously subjected to metrology within the EFEM;

(iii) subsequent wafer processing is prioritized over metrology operations; and (iv) metrology operations are completed without requiring transfer to a separate metrology tool, thereby eliminating intermediate metrology transport steps between processing modules.

9. A method to increase the overall output of semiconductor production facility as well as enhance physical data and mapping of the Si wafers fabricated therein, using an equipment front end module (EFEM) with an integrated metrology unit therein, that is connected to a Si wafer processing module, and a sequencing module, comprising the steps of:

(a) inserting of a set of Si wafers arranged in a Si wafer carrier, into a loading port of said EFEM;

(b) scheduling the wafer movement dynamically with said sequencing module such that:

(i) a first wafer is processed in the processing module;

(ii) a second wafer, remaining idle in the wafer carrier, is simultaneously metrology examined within the EFEM;

(iii) subsequent wafer processing is prioritized over metrology operations until all wafers in said wafer carrier have been processed and metrology examined and returned to said Si wafer carrier; and (iv) metrology examinations are completed without requiring transfer to a separate metrology tool, thereby eliminating intermediate metrology transport steps between processing modules.

* * * * *